(12) United States Patent
Apelsmeier et al.

(10) Patent No.: US 12,453,062 B2
(45) Date of Patent: Oct. 21, 2025

(54) SYSTEMS AND METHODS FOR INTEGRATED DOUBLE SIDE COOLING OF A POWER MODULE OF AN INVERTER

(71) Applicant: BorgWarner US Technologies LLC, Wilmington, DE (US)

(72) Inventors: Andreas Apelsmeier, Pollenfeld (DE); Chetan Ugare, Nuremberg (DE); Stefan Berindan, Nuremberg (DE); Syed Shah Fahad Hassan, Erlangen (DE)

(73) Assignee: BORGWARNER US TECHNOLOGIES LLC, Wilmington, DE (US)

( * ) Notice: Subject to any disclaimer, the term of this patent is extended or adjusted under 35 U.S.C. 154(b) by 238 days.

(21) Appl. No.: 18/358,560

(22) Filed: Jul. 25, 2023

(65) Prior Publication Data
US 2025/0040108 A1    Jan. 30, 2025

(51) Int. Cl.
*H05K 7/20* (2006.01)
*B60L 53/20* (2019.01)

(52) U.S. Cl.
CPC ......... *H05K 7/209* (2013.01); *H05K 7/20409* (2013.01); *H05K 7/20927* (2013.01); *B60L 53/20* (2019.02); *B60L 2210/40* (2013.01)

(58) Field of Classification Search
CPC ............. H01L 23/473; H01L 2023/405; H01L 2023/4062; H01L 21/4882; H01L 23/3677; H01L 23/427; H01L 23/46; H05K 7/20254; H05K 5/30; H05K 7/20272; H05K 7/20854; H05K 7/209; H05K 7/20409; H05K 7/20927; B60L 53/20; B60L 2210/40; B60L 58/26; F28F 3/12; H01G 2/10; H01G 2/08; H01G 4/40; H01M 10/625; H01M 2220/20; H02K 5/18; H02K 11/33; H02K 5/203; H02K 9/19
See application file for complete search history.

(56) References Cited

U.S. PATENT DOCUMENTS

| | | | | |
|---|---|---|---|---|
| 5,426,565 A | * | 6/1995 | Anderson | H01L 23/4006 257/E23.084 |
| 7,215,545 B1 | * | 5/2007 | Moghaddam | H01L 23/3732 361/708 |
| 9,237,676 B2 | * | 1/2016 | Gohara | H05K 7/20254 |
| 9,578,788 B2 | | 2/2017 | Tang et al. | |

(Continued)

FOREIGN PATENT DOCUMENTS

CN    116469680 A    7/2023

OTHER PUBLICATIONS

David et al. System and method for cooling an electrical component of a vehicle, CN116469680 (Year: 2023).*

*Primary Examiner* — Michael A Matey
(74) *Attorney, Agent, or Firm* — Joshua M. Haines; Bookoff McAndrews, PLLC

(57) ABSTRACT

A system for an electric vehicle includes: an inverter housing including an inner wall, a first channel, and an exterior surface; and a heatsink coupled to the exterior surface of the inverter housing, the heatsink including a second channel; wherein the first channel in the inverter housing and the second channel in the heatsink define a cooling circuit, and wherein the first channel is fluidly connected to the second channel to pass a coolant through the cooling circuit.

18 Claims, 13 Drawing Sheets

(56) References Cited

U.S. PATENT DOCUMENTS

| | | | | |
|---|---|---|---|---|
| 9,955,613 B2* | 4/2018 | Harkins | ............. | H05K 7/20927 |
| 10,096,537 B1* | 10/2018 | Chen | ................... | F28D 15/0266 |
| 11,596,088 B2* | 2/2023 | Zhou | ................ | H05K 7/20927 |
| 2008/0169088 A1* | 7/2008 | Aoki | ...................... | H02K 9/227 |
| | | | | 165/104.19 |
| 2008/0291628 A1* | 11/2008 | Aoki | ..................... | H01L 23/473 |
| | | | | 361/699 |
| 2010/0128436 A1* | 5/2010 | Edmunds | ............ | F28D 15/0233 |
| | | | | 165/104.26 |
| 2019/0296658 A1 | 9/2019 | Chung et al. | | |
| 2019/0335608 A1* | 10/2019 | Song | .................. | H05K 7/20854 |
| 2020/0375069 A1* | 11/2020 | Zhang | ................ | H01L 23/4093 |
| 2021/0183797 A1* | 6/2021 | Vincent | ................ | H01P 11/002 |
| 2022/0142016 A1* | 5/2022 | Gradinger | .......... | H05K 7/20927 |
| | | | | 361/699 |
| 2022/0157801 A1* | 5/2022 | Teysseyre | ............... | H01L 23/46 |
| 2022/0248560 A1* | 8/2022 | Zhou | ............... | H05K 7/2039 |
| 2023/0232581 A1* | 7/2023 | Uchibe | ............. | H05K 7/20272 |
| 2023/0232597 A1* | 7/2023 | David | ...................... | H05K 5/30 |
| | | | | 361/701 |
| 2023/0232599 A1* | 7/2023 | Suzuki | ............... | H05K 7/20927 |
| | | | | 361/699 |

* cited by examiner

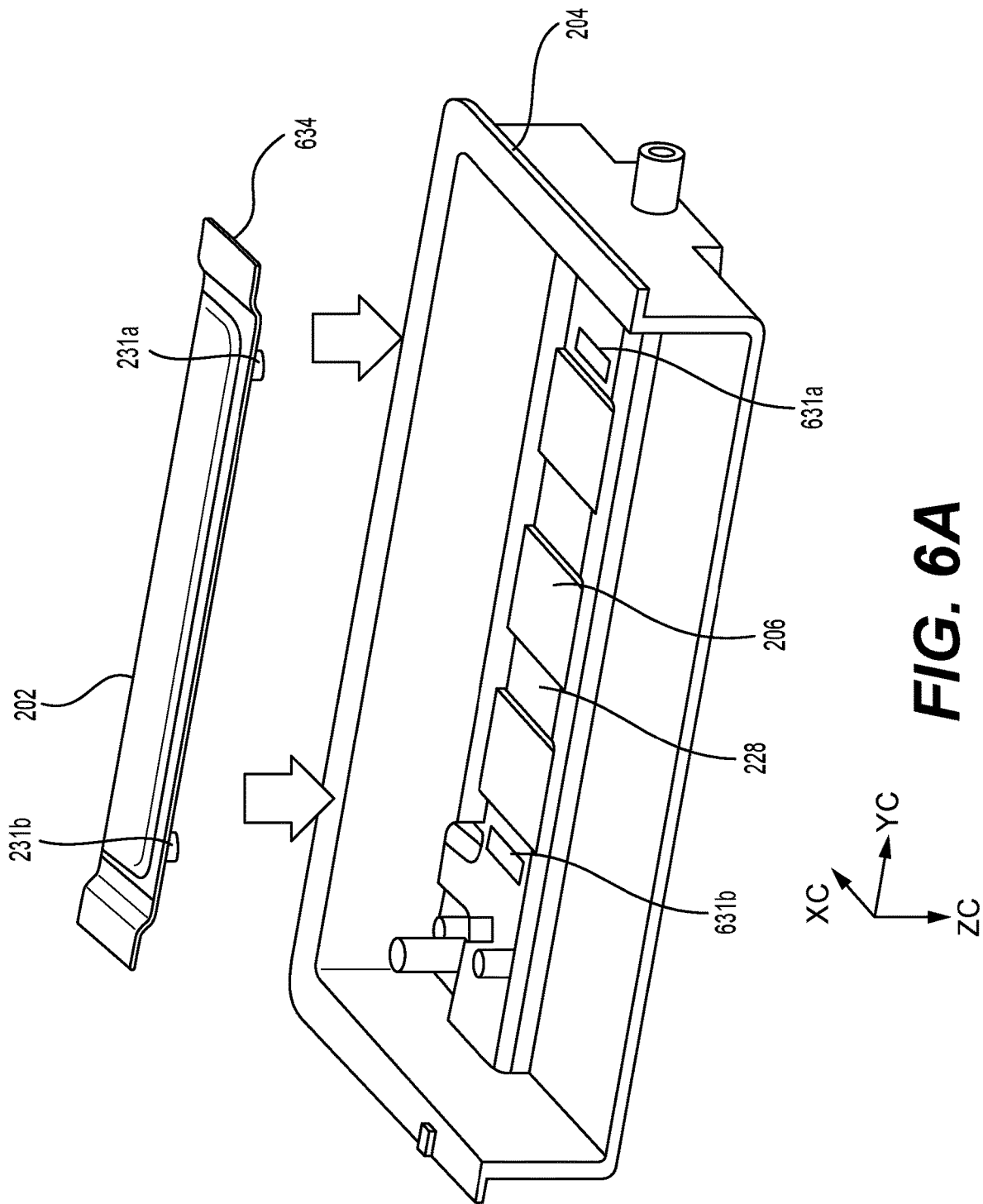

SYSTEMS AND METHODS FOR INTEGRATED DOUBLE SIDE COOLING OF A POWER MODULE OF AN INVERTER

TECHNICAL FIELD

Various embodiments of the present disclosure relate generally to an inverter cooling system, and, more particularly, to systems and methods for integrated double side cooling of a power module of an inverter.

INTRODUCTION

An inverter system may include a power module, inverter housing, and a printed circuit board ("PCB"). Thermal load management of an inverter system may be necessary to improve performance and reliability of the system. Cooling circuits may be used to transfer heat from the power module in order to cool the power module. Improper cooling of the power module may lead to improper operation of the inverter system.

The present disclosure is directed to overcoming one or more of these above-referenced challenges.

SUMMARY OF THE DISCLOSURE

In some aspects, the techniques described herein relate to a system for an electric vehicle, the system including: an inverter housing including an inner wall, a first channel, and an exterior surface; and a heatsink coupled to the exterior surface of the inverter housing, the heatsink including a second channel; wherein the first channel in the inverter housing and the second channel in the heatsink define a cooling circuit, and wherein the first channel is fluidly connected to the second channel to pass a coolant through the cooling circuit.

In some aspects, the techniques described herein relate to a system, wherein the cooling circuit further includes two connection channels connecting the first cooling channel and the second cooling channel.

In some aspects, the techniques described herein relate to a system, wherein the two connection channels are in the heatsink.

In some aspects, the techniques described herein relate to a system, further including: an inverter housing cover, wherein the first channel is defined by the inner wall of the inverter housing and the inverter housing cover.

In some aspects, the techniques described herein relate to a system, wherein the heatsink is coupled to the inverter housing by a stir weld.

In some aspects, the techniques described herein relate to a system, further including: a gasket to fluidly seal the heatsink to the inverter housing.

In some aspects, the techniques described herein relate to a system, wherein the heatsink further includes fins in the second channel.

In some aspects, the techniques described herein relate to a system, wherein the inverter housing further includes fins in the first channel.

In some aspects, the techniques described herein relate to a system, wherein the inverter includes: the inverter housing, the heatsink, and a power module coupled to the inverter housing, the power module configured to switch direct current electricity into alternating current, wherein the heatsink is configured to cool the power module.

In some aspects, the techniques described herein relate to a vehicle including the inverter described herein.

In some aspects, the techniques described herein relate to an inverter, including: a housing including a first cooling channel; and a heatsink including a second cooling channel, wherein the heatsink is coupled to the housing, wherein the first cooling channel and the second cooling channel provide a cooling circuit for the inverter.

In some aspects, the techniques described herein relate to an inverter, wherein the first cooling channel includes fins.

In some aspects, the techniques described herein relate to an inverter, wherein the second cooling channel includes fins.

In some aspects, the techniques described herein relate to an inverter, wherein the heatsink is coupled to the housing by a weld.

In some aspects, the techniques described herein relate to an inverter, wherein the cooling circuit further includes two connection channels connecting the first channel and the second channel.

In some aspects, the techniques described herein relate to a system including: an inverter configured to convert DC power from a battery to AC power to drive a motor, wherein the inverter includes: a power module; an inverter housing coupled to the power module, the inverter housing including a first channel; an inverter housing cover to cover the first channel; and a heatsink coupled to the inverter housing, the heatsink including a second channel and two connection channels, wherein the first channel is fluidly connected to the second channel by the two connection channels to pass a coolant through the inverter to cool the power module.

In some aspects, the techniques described herein relate to a system, wherein the first channel includes fins.

In some aspects, the techniques described herein relate to a system, wherein the second channel includes fins.

In some aspects, the techniques described herein relate to a system, wherein the heatsink is coupled to the inverter housing by a weld.

In some aspects, the techniques described herein relate to a system, wherein the inverter further includes: a printed circuit board on an opposite side of the heatsink from the inverter housing cover.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims. It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

FIG. 6A depicts a heatsink and inverter housing, according to one or more embodiments.

DETAILED DESCRIPTION OF EMBODIMENTS

Figure 1:
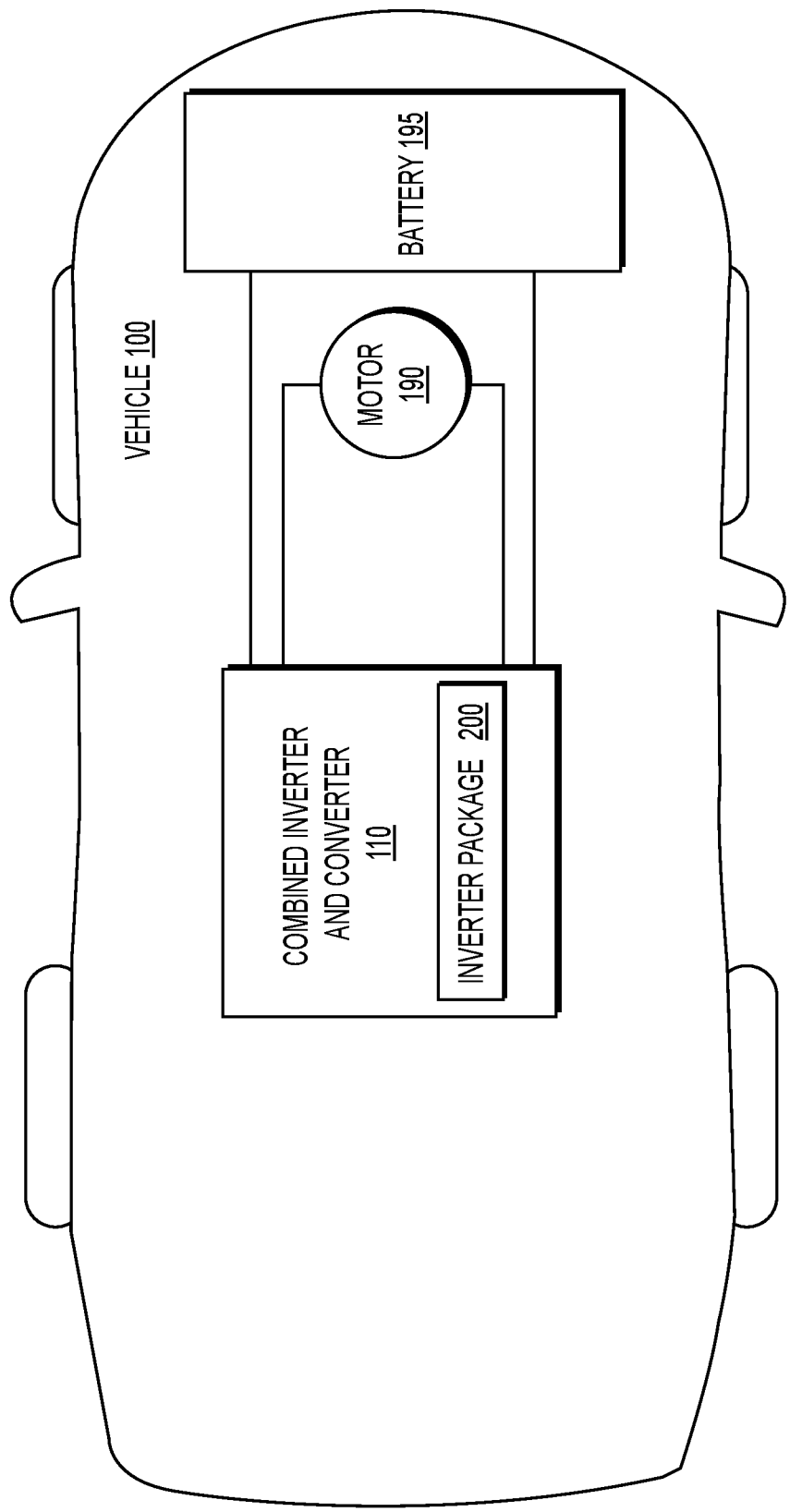
FIG. 1 depicts an exemplary system infrastructure for a vehicle including a combined inverter and converter including an inverter package, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to an inverter cooling system, and, more particularly, to systems and methods for integrated double side cooling of a power module of an inverter.

Inverters, such as those used to drive a motor in an electric vehicle, for example, are responsible for converting High Voltage Direct Current ("HVDC") into Alternating Current ("AC") to drive a motor. Inverters may include a housing, a power module, a printed circuit board ("PCB"), and a cooling circuit (also referred to as a cooling system). Power module may include one or more silicon carbide ("SiC")-based power switches that deliver relatively high power densities and efficiencies needed to extent battery range and performance. The power module may contain circuitry and components that are configured to convert DC current from the electric vehicle battery to AC current, which can be utilized within the electric motor that drives the propulsion system. The housing of an inverter may structurally connect the components of the inverter together. The PCB may include control and gate driver boards. The control and gate driver boards may further include active components such as power supplies, active discharge, and gate drivers. The cooling circuit of the inverter may transfer waste heat (e.g., heat generated while in operation) from the system to a coolant associated with the fluid circuits and transfer the fluid to a radiator, heat exchanger, or other engine components, as described herein.

Inverter systems may have high ambient temperature during operation. The performance, assembly process and time, and reliability of the power modules of an inverter system may all be dependent on a built-in coolant structure. Cooling structures of inverter systems may improve performance and reliability. Some inverter systems utilize thermal management methods to cool the active components of the power module. For example, some thermal management methods may include coupling a heatsink to a first and second side of a power module. By utilizing multiple heatsinks, the manufacturing process of the system may be more complex and this may lead to increased costs of assembly and material. Further, multiple heatsinks may lead to an increased scrap rate of components (e.g., a power module) during construction as increased complexity leads to more mistakes. Further, inverter systems that utilize two heatsinks may have an increased risk of coolant leaking within an inverter system due to the increased number of sealing components inside the inverter.

One or more embodiments of the system described herein may provide a cooling circuit (e.g., a cooling system) within an inverter. The cooling circuit may include a first channel built into the inverter housing, including a housing cover as a wall defining a side of the first channel. The cooling circuit may include a second channel that is mounted and sealed directly inside the inverter housing (e.g., the second channel being defined by a heatsink). The first channel and second channel may include fin structures to increase cooling.

One or more embodiments of the system described herein may provide thermal management of the power module with multiple cooling elements, thermal management of the power module(s), and thermal management of the inner temperature of the inverter. One or more embodiments may decrease the complexity and cost of assembling inverter housing components (e.g., an inverter cover) and the scrap rate of the components within the inverter system. One or more embodiments may provide a single (only one) heatsink within the cooling system. The single heatsink may decrease complexity and decrease the chances of leakage of coolant within an inverter system. One or more embodiments of the system described herein may allow for direct sintering of power modules with the inverter housing.

One or more embodiments of the system described herein may reduce the risk of coolant leaking inside of an inverter by integrating a coolant channel inside the housing geometry while maintaining the fluid flow as much as possible on the exterior area of the inverter housing. One or more embodiments of the system described herein may include a cooling circuit with pin fins attached, used to disperse heat into a coolant that flows through the cooling circuit. The pin fins may connect the inverter housing cover to the inverter housing. Further, the pin fins may be attached to the cover of the inverter housing externally and may be pressed on to the housing for thermal conduction.

One or more embodiments of the system described herein may include a cooling circuit that includes a second channel defined by a heatsink. The heatsink may be made of a different material than the inverter housing and may have better thermal conductance. The heatsink may be hermetically sealed to the inverter housing.

FIG. 1 depicts an exemplary system infrastructure for a vehicle including a combined inverter and converter including an inverter package system, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may include an inverter package 200. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
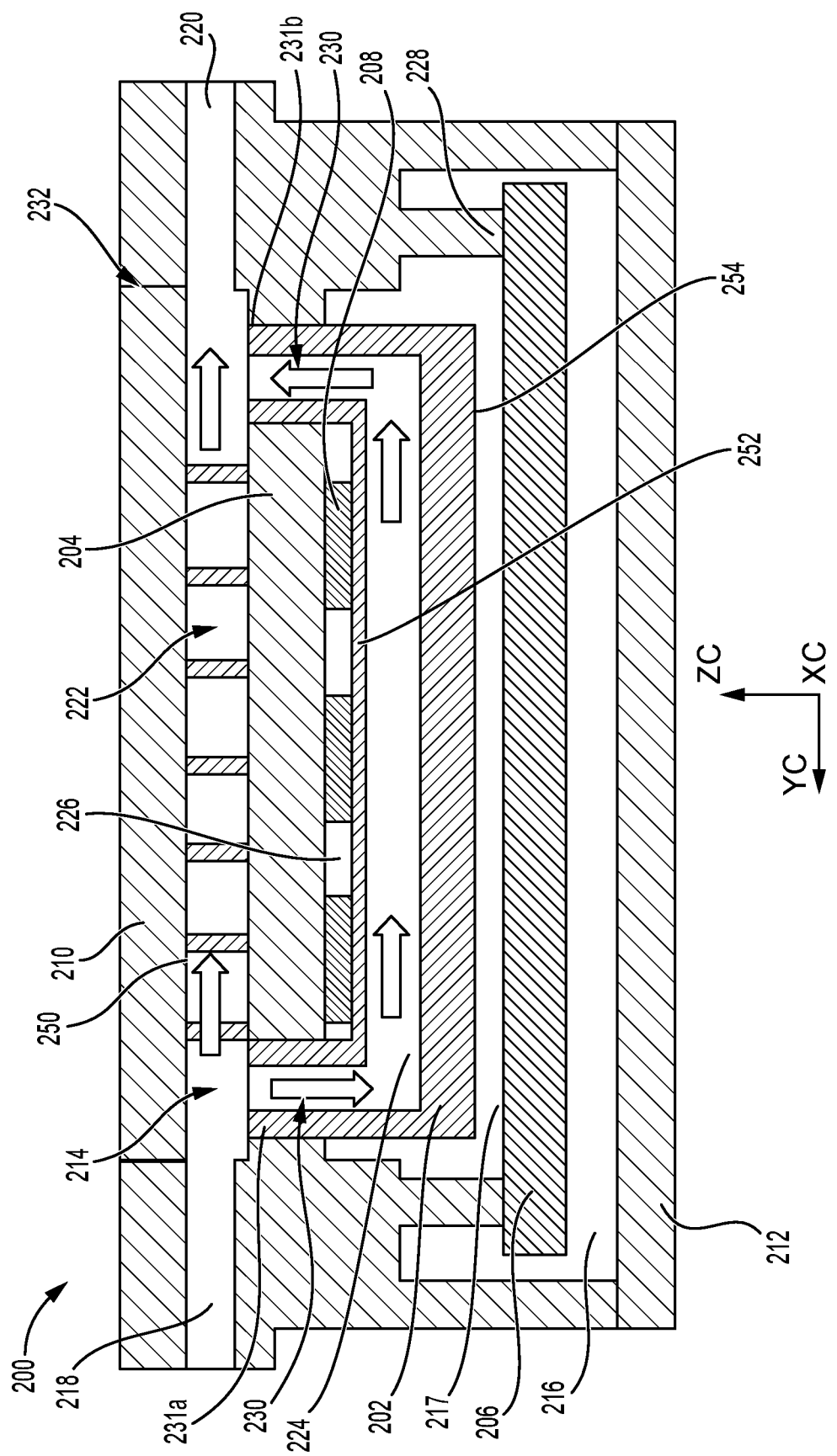
FIG. 2 depicts an exemplary inverter package including a cooling circuit, according to one or more embodiments.

FIG. 2 depicts an exemplary inverter package 200 including a cooling circuit 214, according to one or more embodiments. The inverter package 200 may include an inverter housing 204, a heatsink 202, a printed circuit board ("PCB") 206, and a power module 208 (e.g., one or more power module, e.g., three power modules, e.g., six power modules). The inverter package 200 may include a first cover 210, a second cover 212, a cooling circuit 214, a first open space 216, and a second open space 217. The inverter housing may be configured to secure the power module 208, the cooling circuit 214, and the PCB 206. For example, the power module 208 may be sintered to the inverter housing 204. The first cover 210 may be located at a first top side of the inverter package 200 and the second cover 212 may be located at a second bottom side opposite of the first cover 210. The first open space 216 (e.g., first gap) may be located within the inverter housing 204 between the second cover 212 and the PCB 206. The second open space 217 (e.g., second gap) may be located within the inverter housing 204 between the heatsink 202 and PCB 206.

The cooling circuit 214 may include an inlet 218, an outlet 220, a first side cooling channel 222, a second side cooling channel 224, and a connection channel 230 (e.g., two connection channels). The cooling circuit 214 may transfer waste heat (e.g., heat generated while in operation) from the inverter package 200 to a coolant flowing through the cooling circuit 214 and transfer the fluid to a radiator, heat exchanger, or other engine component. The flow of the coolant may be indicated by the arrows in the cooling circuit 214. The inlet 218 may be located at a third side of the inverter package 200, between the first cover 210 and second cover 212. The outlet 220 may be located at a fourth side of the inverter package 200, also between the first cover 210 and second cover 212, and located on the opposite side of the inverter package 200 from the third side.

Figure 3:
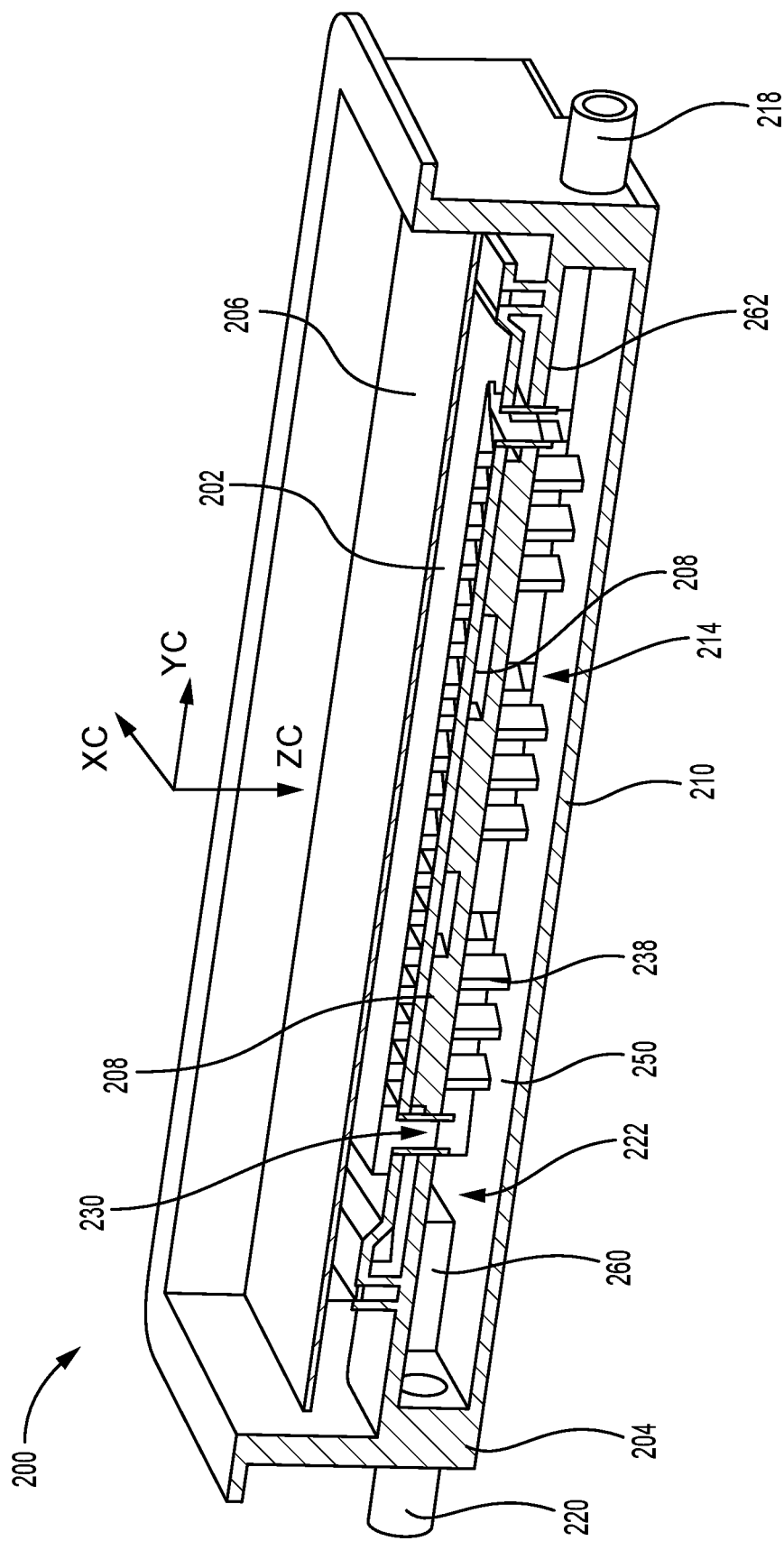
FIG. 3 depicts an exemplary inverter package including a cooling circuit with a first and second cooling channel, according to one or more embodiments.

The inlet 218 may be configured to receive a coolant into the cooling circuit 214 and the outlet 220 may expel the coolant from the cooling circuit 214. The first side cooling channel 222 may be defined by inner walls 260 (as shown in FIG. 3) of a cavity within the inverter housing 204 and the first cover 210 of inverter housing 204. Thus, inner walls 260 defining the cavity in the inverter housing 204 and a surface 250 of the first cover 210 may define the first side cooling channel 222. The connection of the first cover 210 and the section of the inverter housing 204 defining the first side cooling channel 222 may be a hermetic seal 232. A hermetic seal may be a stir friction welding seal, an ultrasound welding seal, a soldering seal, or a gasket seal, for example. The first side cooling channel 222 may have a generally rectangular cross section at a XC-ZC axis cross section. Further, as will be discussed in greater detail below, the first side cooling channel 222 may include fins 238 (as shown in FIG. 3) that extend in the ZC direction.

The second side cooling channel 224 may be defined by a heatsink 202 having a hollow interior or a hollow interior with Pin fins or Wavy fins to increase thermal exchange surface to the cooling fluid. The interior of heatsink 202 may be configured to allow coolant to flow from a first end 231a of heatsink 202 to a second end 231b of heatsink 202. As will be discussed in greater detail below, the first end 231a and second end 231b of the heatsink 202 may be structures that fluidly couple the heatsink 202 to the inverter housing 204. The heatsink 202 may have a first surface 252 and a second surface 254 opposite of the first surface 252 along the ZC axis.

For example, the first surface 252 of the heatsink 202 may be coupled to the inverter housing 204 (e.g., exterior surface 226) and/or the power modules 208 by a thermal interface material (TIM). The TIM may include epoxy, silicon, or other elastomer products, for example. The TIM may be provided as a dielectric pad, heat spreader, thermal compound, thermal gel (e.g., dispensable gel), thermal tape, phase change material, gap pad, thermal grease, or alternative thermal material, for example. An advantage of the inverter package 200 with TIM may be that the heatsink 202 may have a stronger and/or more durable connection to the inverter housing 204 and/or the power modules 208. The heatsink 202 may be coupled, e.g., by a hermetic seal, to a copper plate 746 (as depicted in FIG. 7B).

A power module 208 (e.g., three power modules) may be located between the heatsink 202 and the inverter housing 204. Power module 208 may be in contact with a first surface 252 of the heatsink 202. Power module 208 may include one or more silicon carbide (SiC)-based power devices that deliver relatively high power densities and efficiencies needed to extend battery range and performance. Power module 208 may include circuitry and components configured to convert direct current (DC) from the battery 195 to alternating current (AC) current, which may be utilized within a drive motor that may drive wheels. Power module 208 may be installed on one or more power board assemblies.

Power module 208 may include a combination of transistors, diodes, metal oxide semiconductor field effect transistors (MOSFETs), insulated-gate bipolar transistors (IGBTs), and silicon-controlled rectifiers (SCRs). Power module 208 may include a combination of transistors, which may allow for the switch-ability of the direction of the current through drive motor from battery 195. Additionally, power module 208 may include devices for inverting applications such as switching direct current electricity into alternating current.

Portions of the inverter housing 204 may transfer heat to a coolant within the first side cooling channel 222. The power module 208, along with portions of the inverter housing 204, may transfer heat to a coolant within the second side cooling channel 224 of the heatsink 202.

The second surface 254 of the heatsink 202 may be adjacent to the second open space 217. The heatsink 202 may be configured to transfer heat to the second side cooling channel 224 located within the heatsink 202. For example, heat may dissipate from the PCB 206, cross the second open space 217, and be received by the heatsink 202. This heat may then transfer to coolant within the second side cooling channel 224.

The second side cooling channel 224 may further include a connection channel 230 (e.g., two connection channels) including the first end 231*a* and second end 231*b* of the heatsink 202. The connection channel 230 may be configured to fluidly connect the first side cooling channel 222 to the second side cooling channel 224. The connection channel 230, as described in greater detail below in FIGS. 7A and 7B, may include a hollow chamber portion that is perpendicular to the first side cooling channel 222 so that coolant in the hollow chamber portion flows in the ZC axial direction.

The inverter housing 204 may include a fixation point 228 (e.g., one or more fixation points, e.g., two fixation points). The fixation point 228 may be threaded and configured to receive a screw that couples the PCB 206 to the inverter housing 204. The fixation point 228 may be located at a position to reduce the PCB 206 mechanical stress and minimize scrappage during use of the inverter package 200. A first open space 216 may be located between a second surface of the PCB 206 and the second cover 212, the second surface of the PCB 206 being opposite of the first surface of the PCB 206.

FIG. 3 depicts an exemplary inverter package 200 including a cooling circuit 214, according to one or more embodiments. The inner walls 260 of the inverter housing 204, a surface 262 of the inverter housing 204, and the surface 250 of the first cover 210 may define the first side cooling channel 222. The inner walls 260 may correspond to the shape of the first cover 210 from the XC-YC plane perspective. The inner walls 260 may include two openings corresponding to the inlet 218 and outlet 220 of the inverter housing 204. The surface 262 of the inverter housing 204 may include an opening (e.g., two openings) corresponding to connection channel 230.

The first side cooling channel 222 may include fins 238 (e.g., twelve pin fins, e.g., thirty six pin fins). Fins 238 may be provided in an extruded, plain, wavy, pin, folded, bonded, active fan, stamping, or cross-cut configuration. The fins 238 may extend from the surface 262 of the inverter housing 204 to the surface 250 of the first cover 210, the surface 262 may be located opposite of the first cover 210. The fins 238 may, for example, be in three groups of four by four fins. Each group of fins 238 may be located opposite of a power module 208 within inverter package 200. The elements described above in FIG. 3 may be similar to corresponding elements described in FIG. 2 in structure and function.

Figure 4:
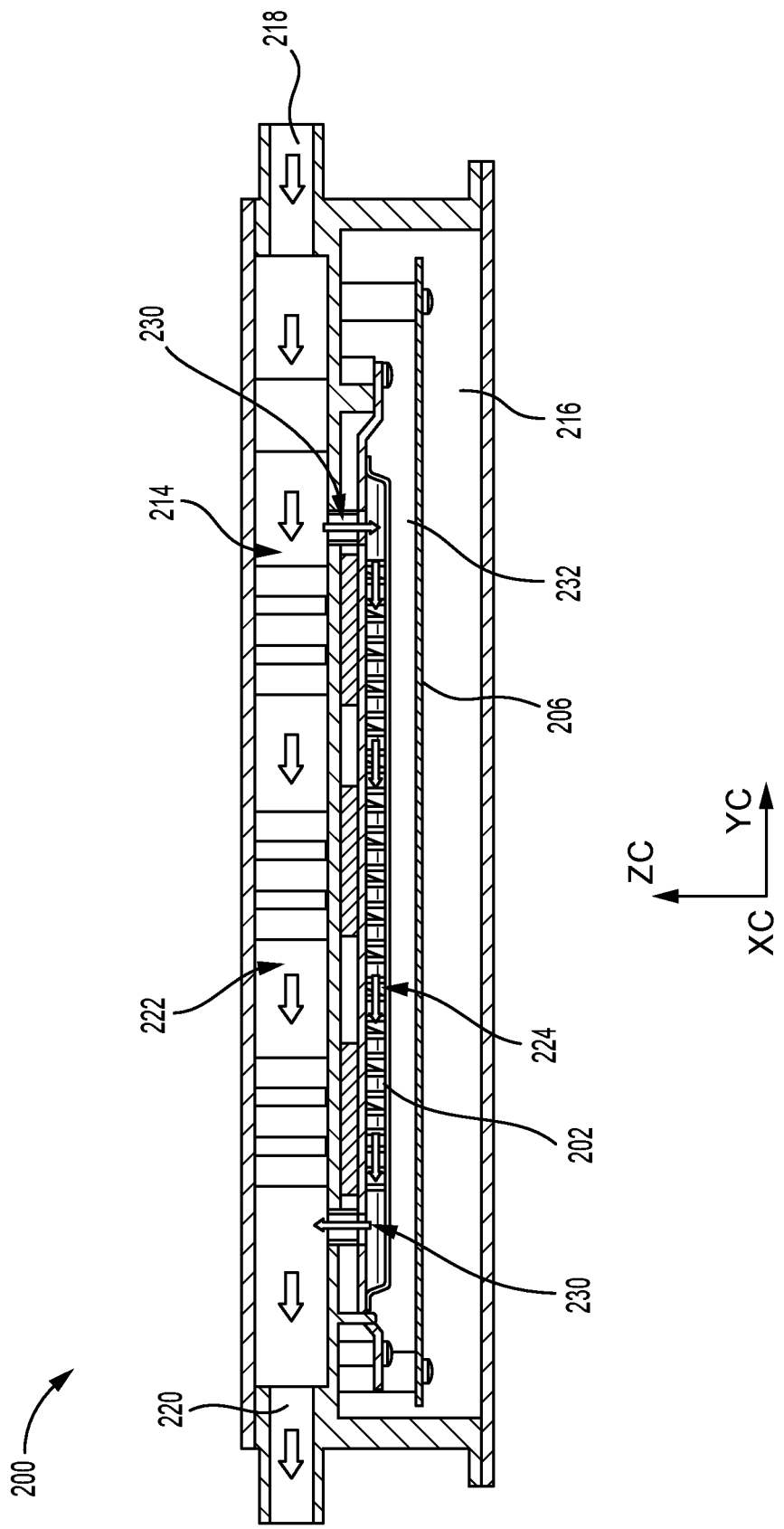
FIG. 4 depicts a cross sectional view of an exemplary inverter package including a cooling circuit with a first and second cooling channel, according to one or more embodiments.

FIG. 4 depicts an exemplary inverter package 200 cooling circuit 214, according to one or more embodiments. The arrows located within the cooling circuit 214 may indicate the flow of coolant through the cooling circuit 214. Coolant may enter the cooling circuit through inlet 218. Coolant may proceed to flow through the first side cooling channel 222 and through the second side cooling channel 224, following the flow path of the arrows. The coolant may flow from inlet 218, in the YC axis direction through the first side cooling channel 222 and out through the outlet 220. Coolant may also, after entering through inlet 218 and entering the first side cooling channel 222, flow substantially perpendicular to the first side cooling channel 222 in the ZC axis direction to enter the second side cooling channel 224 through a connection channel 230.

Coolant may then flow in the YC axis direction through the second side cooling channel 224 and then flow substantially perpendicular to the second side cooling channel 224 in the YC axis direction and merge with the first side cooling channel 222 by exiting through an outlet of connection channel 230. As coolant flows through the cooling circuit 214, heat may flow from the inverter housing 204, power module 208, PCB 206, and heatsink 202 into the coolant. The heated coolant may then be expelled from the cooling circuit 214 through outlet 220.

Figure 5:
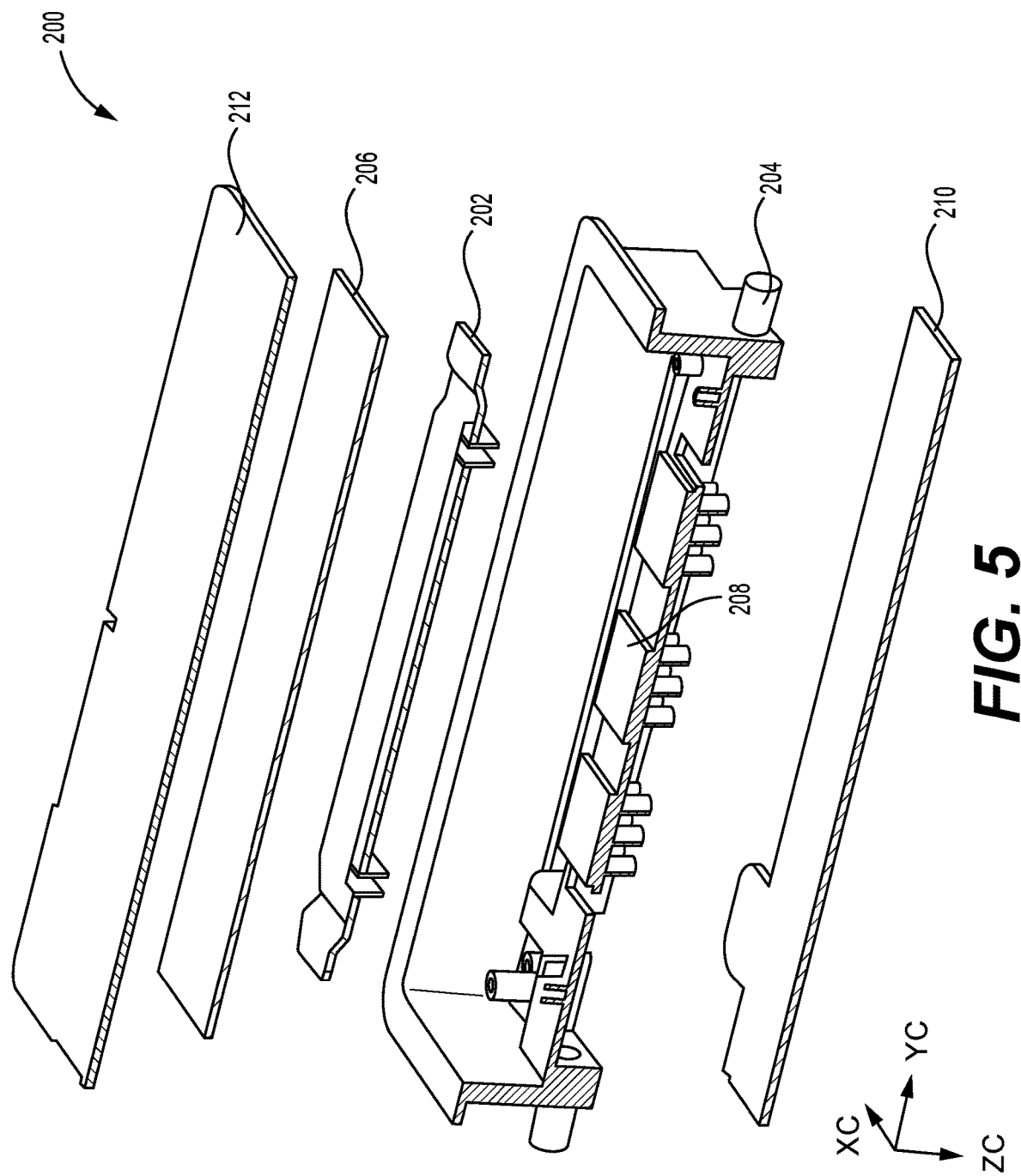
FIG. 5 depicts an exploded view of an exemplary inverter package including a cooling circuit with a first and second cooling channel, according to one or more embodiments.

FIG. 5 depicts an exploded view of an exemplary inverter package 200 including a cooling circuit with a first and second cooling channel, according to one or more embodiments. The inverter package 200 may include inverter housing 204, a first cover 210, a second cover 212, a power module 208, a heatsink 202, and a PCB 206. The inverter housing 204 may be configured to receive and couple to a first cover 210 and a second cover 212. The first cover 210, along with the inverter housing 204 (e.g., inner walls 260 and surface 262) may define a first coolant channel (e.g., the first side cooling channel 222 shown in FIG. 2).

FIG. 6A-6D depict an assembly operation for an exemplary inverter package 200 including a cooling circuit 214, according to one or more embodiments.

Figure 6B:
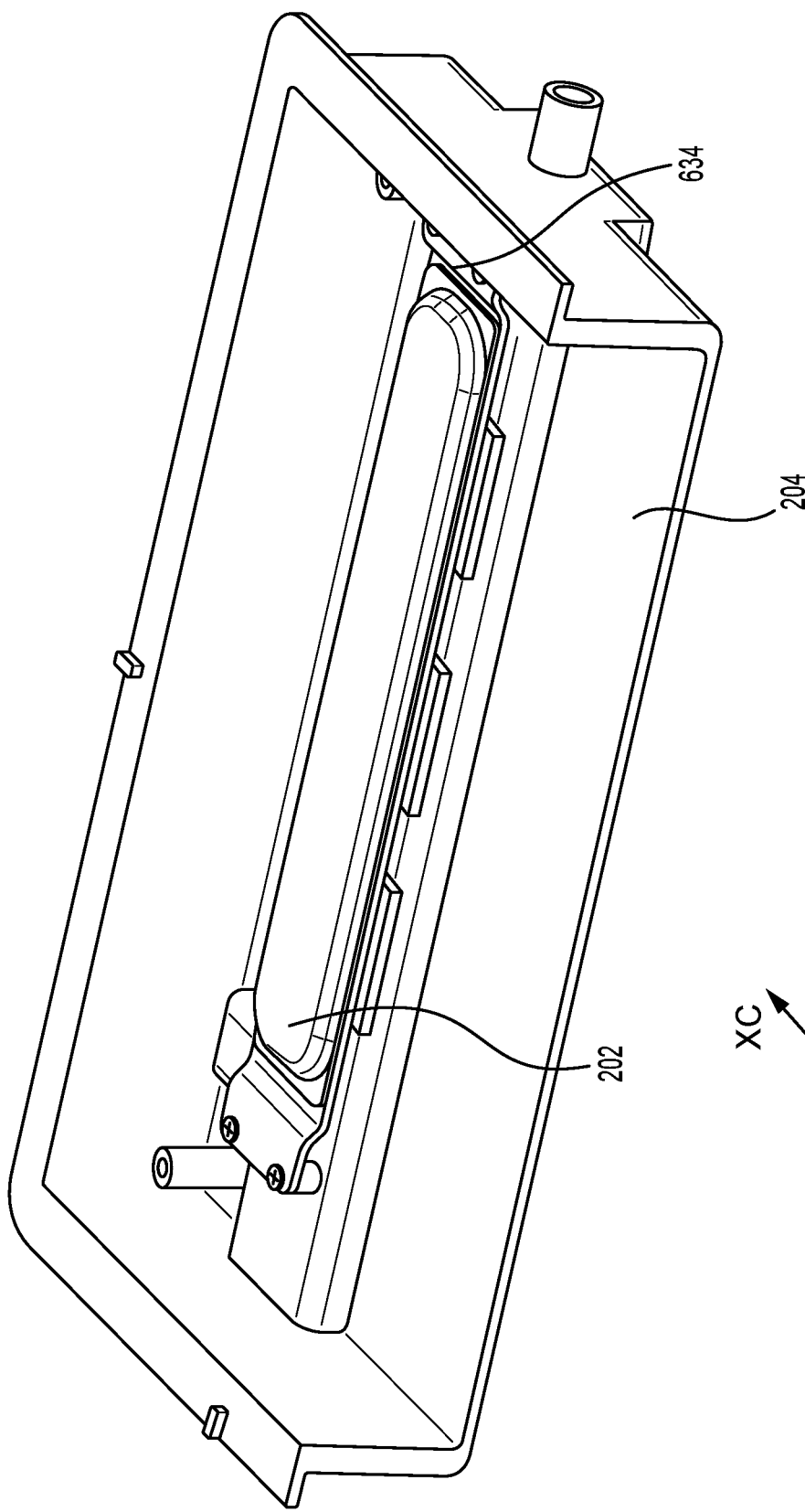
FIG. 6B depicts a heatsink coupled to an inverter housing, according to one or more embodiments.

FIG. 6A depicts a heatsink 202 and inverter housing 204, according to one or more embodiments. The heatsink 202 and inverter housing 204 may be combined to create an inverter package 200. As depicted by the arrows, the heatsink 202 may be coupled to the inverter housing 204. The power modules 208 may be sintered to the inverter housing 204, prior to coupling the heatsink 202. A first surface (e.g., first surface 252 depicted in FIG. 2) of the heatsink 202 may contact, when mounted, to a surface 226 of the inverter housing 204 and a power module 208 (e.g., three power modules). The coupling of the heatsink 202 to the inverter housing 204 may be described further in FIG. 6B.

FIG. 6B depicts a heatsink 202 mounted to an inverter housing 204, according to one or more embodiments. FIG. 6B depicts the heatsink 202 and inverter housing 204 once coupled (e.g., mounted). The coupling may take place once the heatsink 202 and inverter housing 204 are aligned. The alignment, for example, may include aligning the first end 231*a* to an opening 631*a* in the surface 262 of the inverter housing 204. The alignment, for example, may further include aligning the second end 231*b* to an opening 631*b* (depicted in FIG. 8) in the surface 262 of the inverter housing 204. The heatsink 202 may include a fixation point 634 (e.g., four fixation points) configured to receive a screw and securely fix the heatsink 202 to the inverter housing 204.

The fixation point 634 may include a mounting hole. The fixation point 634 may be circular or any polygon shape. The fixation point 634 may have a threaded interior configured to receive a screw. For example, the heatsink 202 may include a fixation point 634 at each of the four corners of the heatsink 202. The heatsink 202 may be coupled to the inverter housing 204 by a set of screws located at the fixation point 634. For example, a gasket (e.g., gasket 740) may be placed in position to surround an end 231a and an end 231b prior to fixing the heatsink 202 to the inverter housing 204.

Figure 6C:
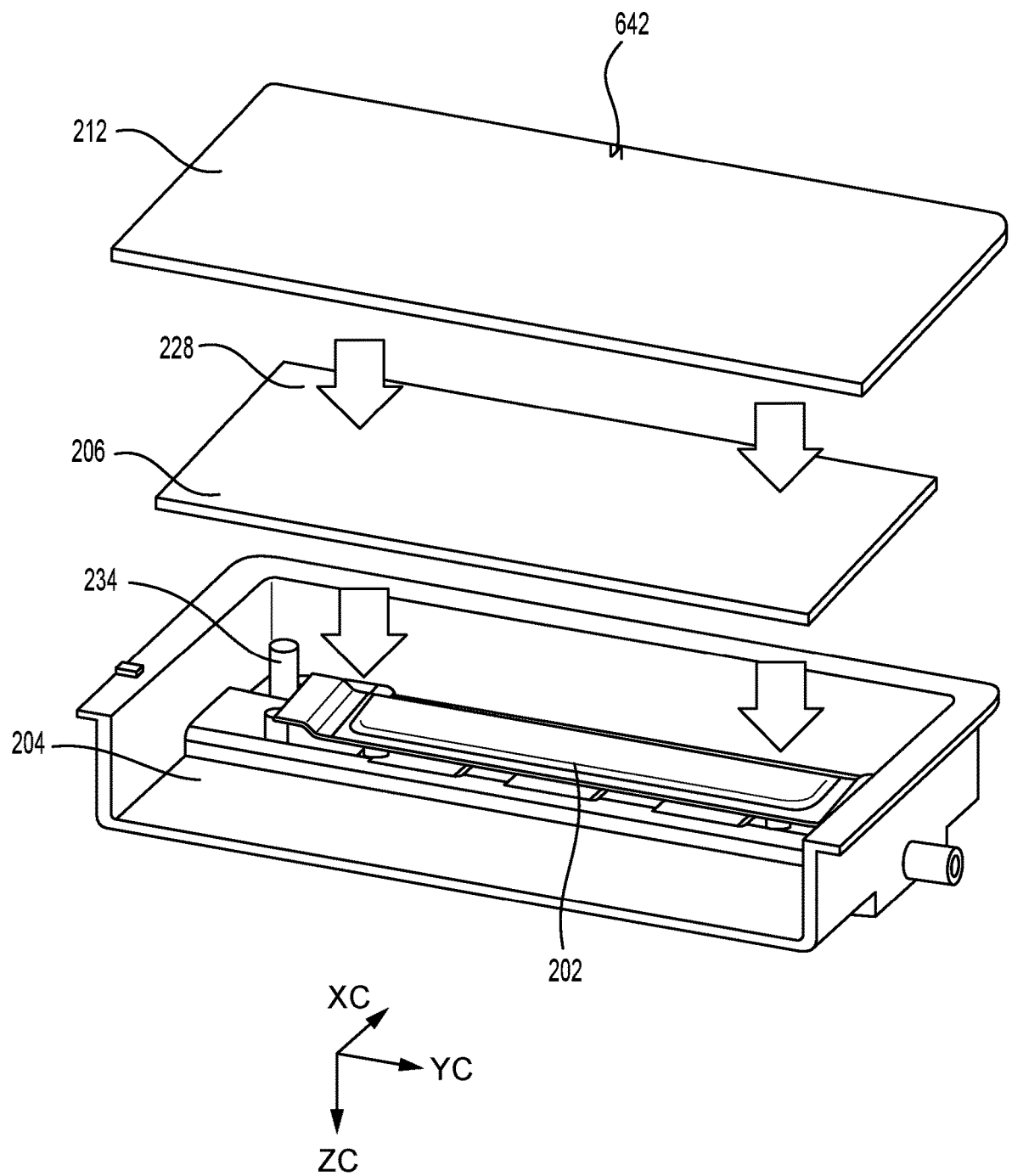
FIG. 6C depicts an inverter housing, a printed circuit board, a heatsink, and an inverter housing cover according to one or more embodiments.

FIG. 6C depicts an inverter housing 204, a PCB 206, a heatsink 202, and a second cover 212, according to one or more embodiments. The heatsink 202 may be mounted to the inverter housing 204, and a PCB 206 and a second cover 212 may be mounted to the inverter housing 204. The heatsink 202 may be mounted to the inverter housing 204, and a PCB 206 may be mounted to the inverter housing 204. The PCB 206 may include a fixation point 228 (e.g., two fixation points). The fixation point 228 may include a mounting hole. The fixation point 228 may be circular or any polygon shape. The fixation point 228 may be threaded and configured to receive a screw (not shown) that couples the PCB 206 to the inverter housing 204. The fixation point 228 may align with an extension 234 (e.g., two extensions) of the inverter housing 204. The extension 234 may be cylindrical and configured to receive a screw.

The PCB 206 may be coupled to the inverter housing 204, and the second cover 212 may be mounted to the inverter housing 204. For example, the second cover 212 may include a fixation point 642 (e.g., two fixation points). For example, the second cover 212 may include a fixation point 642 (e.g., a first fixation point along a first edge of the second cover 212 and a second fixation point along a second edge of the second cover 212, the second edge being adjacent and connecting to the first edge of the second cover 212). The fixation point 642 may include a mounting hole. The fixation points 642 may be may be circular or any polygon shape. The fixation point 634 may be threaded and configured to receive a screw that couples the second cover 212 to the inverter housing 204.

Figure 6D:
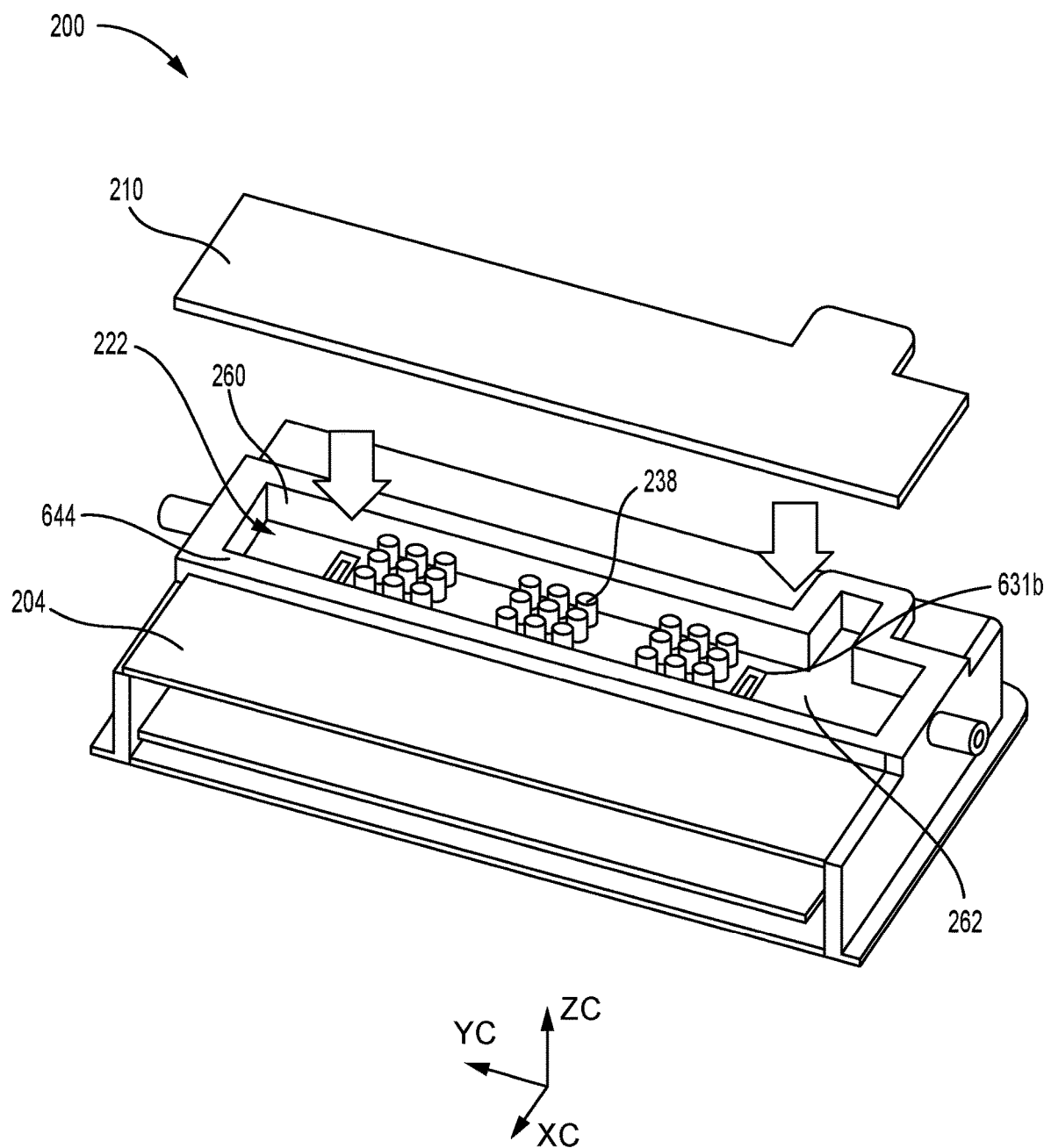
FIG. 6D depicts a housing cover and an exemplary inverter package, according to one or more embodiments.

FIG. 6D depicts a housing cover (e.g., first cover 210) and an exemplary inverter package 200, according to one or more embodiments. The first cover 210 may be mounted to the inverter housing 204. For example, the inverter housing 204 may include a raised surface 644 that extends from the surface of the inverter housing 204. The inner walls 260 may correspond to the raised surface 644. The raised surface 644 may extend around the first side cooling channel 222 located within the inverter housing 204. The raised surface 644 may receive the first cover 210. The first cover 210 may be fixated to the raised surface 644 of the inverter housing by stir welding (e.g., at the hermetic seal 232 as depicted in FIG. 2). The surface 250 of the first cover 210 facing into the inverter housing 204 may be configured to define an interior wall of the first side cooling channel 222.

Figure 7A:
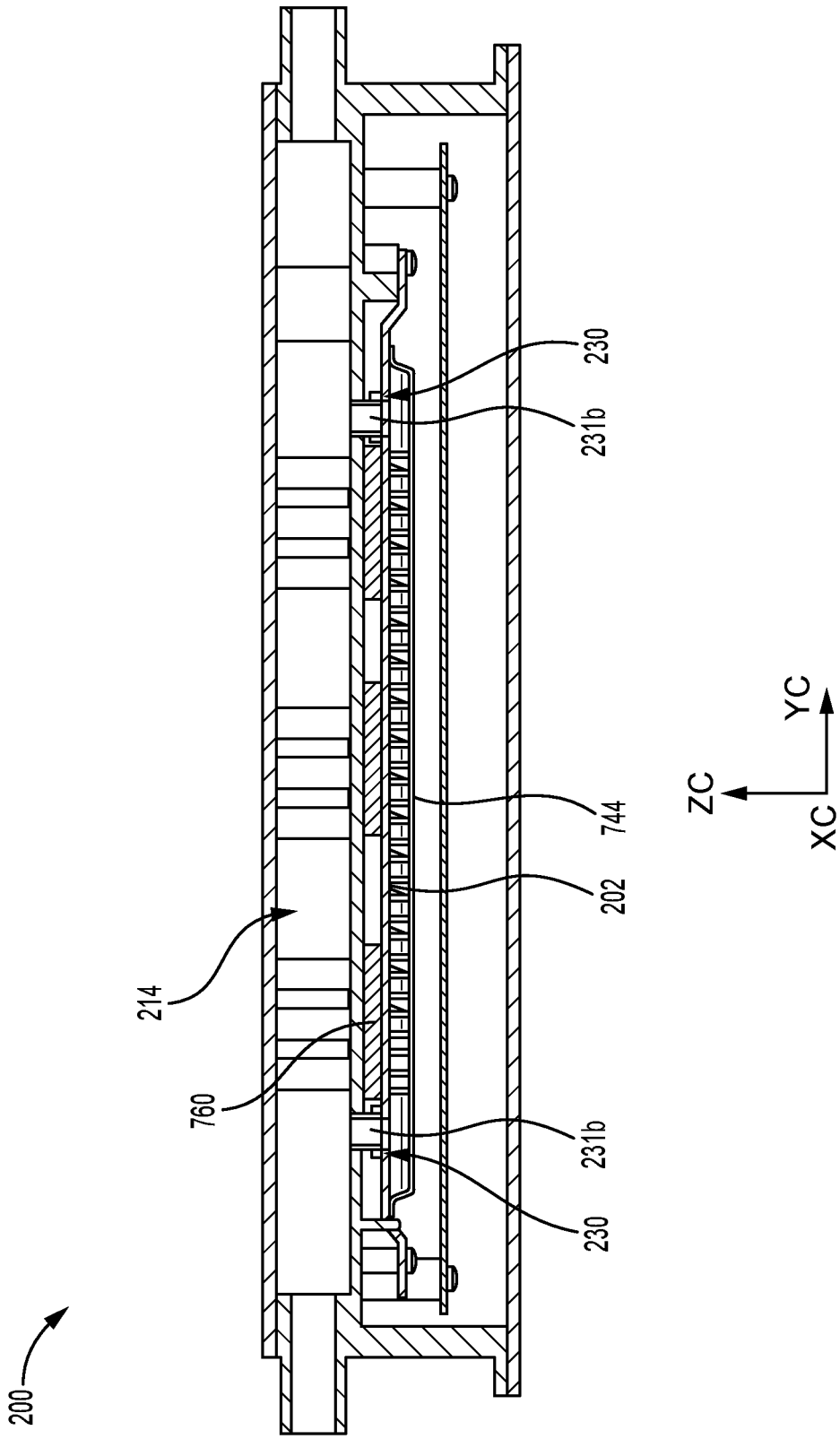
FIG. 7A depicts an exemplary inverter package including a cooling circuit, according to one or more embodiments.
Figure 7B:
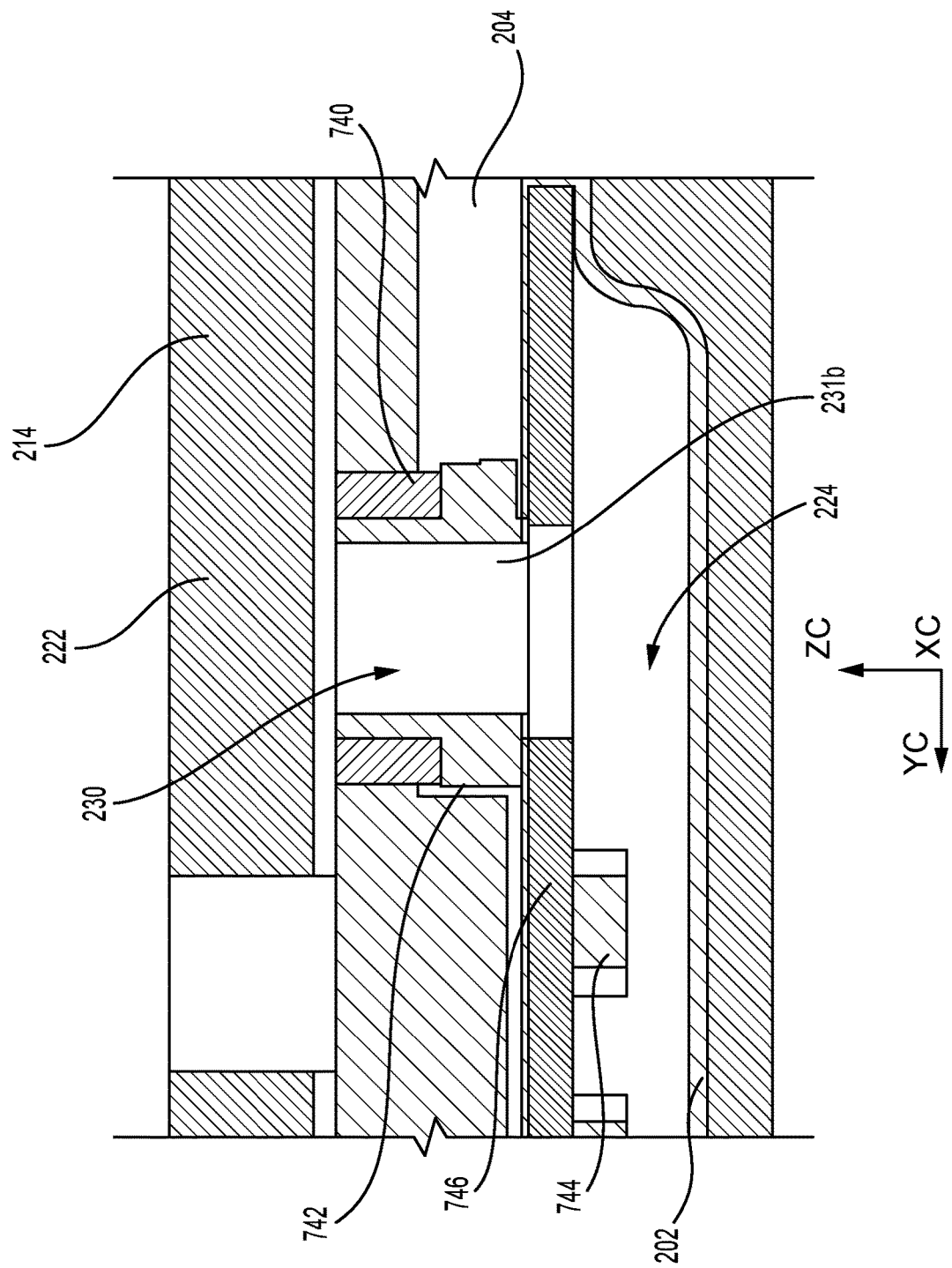
FIG. 7B depicts an exemplary heatsink coupled to a coolant channel in an inverter package, according to one or more embodiments.

FIG. 7A depicts an exemplary inverter package 200 including a cooling circuit 214, according to one or more embodiments. FIG. 7A depicts a cross section of the inverter package 200 described in FIG. 2. The inverter package 200 may include a connection channel 230 (e.g., two connection channels). The connection channel 230 may be defined by an end 231a, 231b of a heatsink 202.

FIG. 7B depicts an exemplary heatsink 202 coupled to an inverter housing 204, according to one or more embodiments. The heatsink 202 may, for example, define the second side cooling channel 224 and a connection channel 230 (e.g., two connection channels). The second side cooling channel 224 may include fins 744. Fins 744 may be provided in an extruded, plain, wavy, pin, folded, bonded, active fan, stamping, or cross-cut configuration. The fins 744 may be, for example, dispersed along the YC axis at similar distances apart. The fins 744 may, for example, extend from one side of heatsink 202 and extend half the distance of the second side cooling channel 224 in the ZC direction.

A copper plate 746 may be located between the heatsink 202 and inverter housing 204. The copper plate 746 may transfer heat from a power module 208 (see FIG. 2) and inverter housing 204 to coolant within the second side cooling channel 224.

The inverter housing 204 may further include a coolant inlet 742. The coolant inlet 742 section of the inverter housing 204 may be formed by a brazed or pressed process. The coolant inlet 742 may be shaped to receive an end 231a, 231b of the heatsink 202. For example, the coolant inlet 742 may be rectangular with rounded corners from a XC-YC plane perspective. Further, the coolant inlet 742 may include a gasket 740 or O-ring that surrounds the connection channel 230. The gasket 740 may fluidly seal the connection between the inverter housing 204 and the heatsink 202. The elements described above in FIGS. 7A and 7B may be similar to corresponding elements described in FIG. 2 in structure and function.

Figure 8:
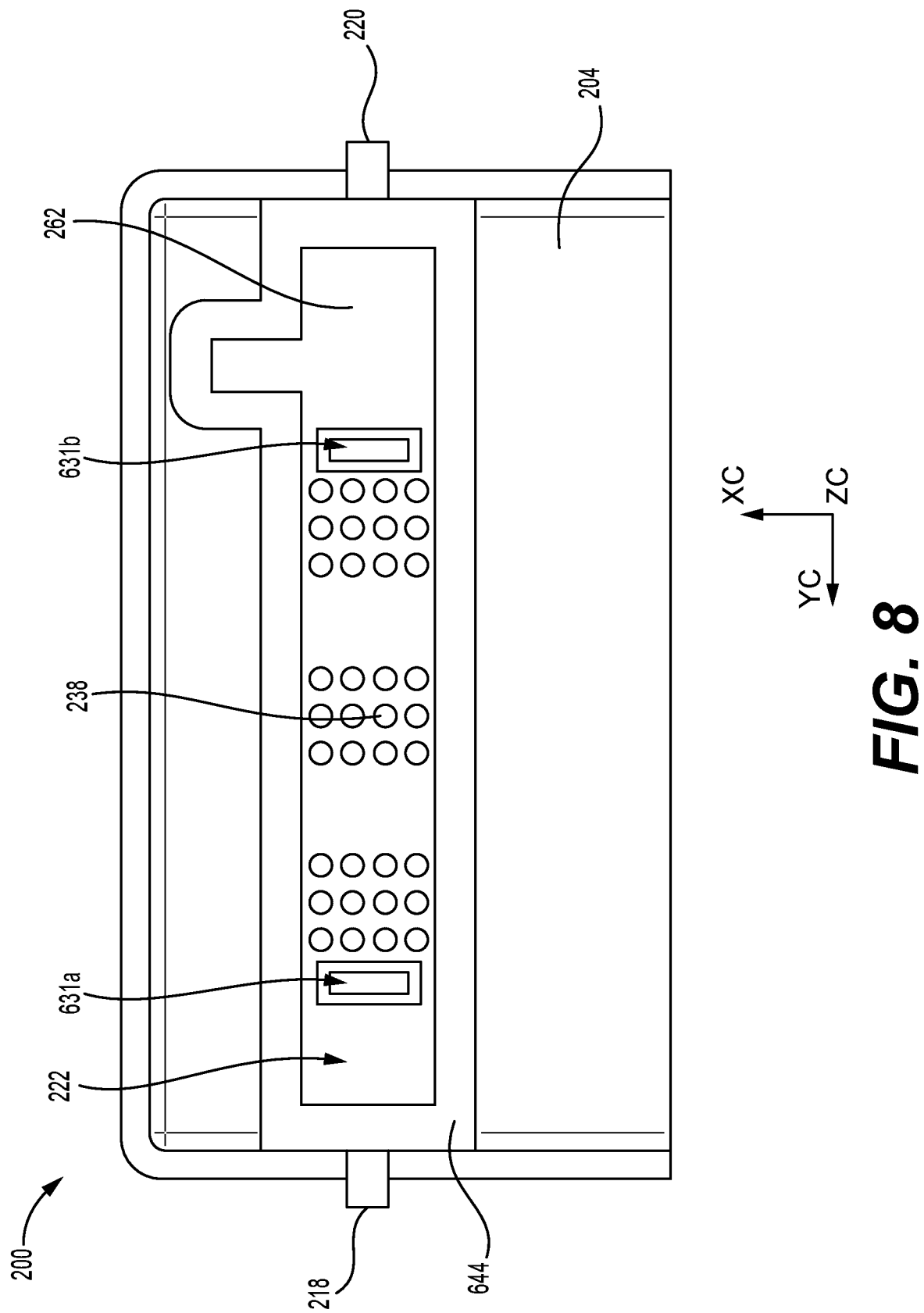
FIG. 8 depicts an overhead view of an exemplary inverter housing coupled to a heatsink, according to one or more embodiments.

FIG. 8 depicts an overhead view of an exemplary inverter housing 204 coupled to a heatsink 202, according to one or more embodiments. For example, an end (e.g., end 231a, 231b) of the heatsink 202 may be welded to an opening (e.g., opening 631a, 631b) of the inverter housing 204. The openings 631a, 631b may be configured to fluidly couple the first side cooling channel 222 of the inverter housing 204 to the connection channel 230.

Figure 9:
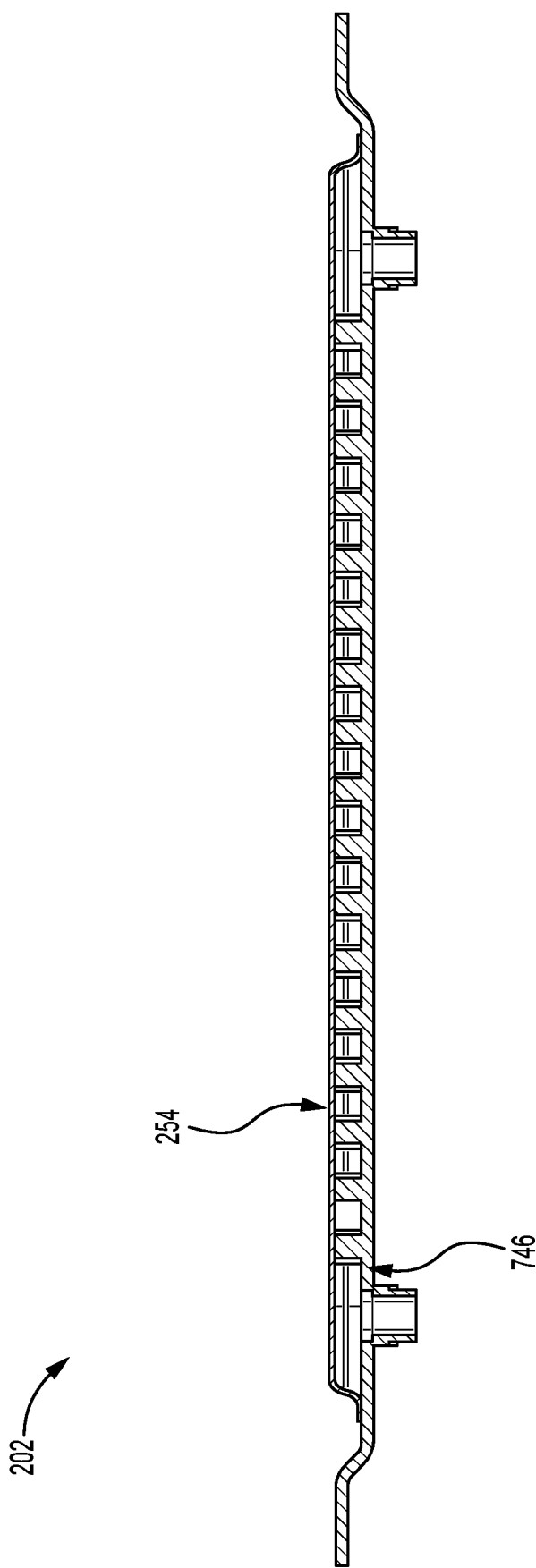
FIG. 9 depicts an exemplary heatsink, according to one or more embodiments.

FIG. 9 depicts an exemplary heatsink, according to one or more embodiments. The heatsink 202 may have a first surface 252 (e.g., a copper plate 746) and a second surface 254 opposite of the first surface 252 along the ZC axis.

The copper plate 746 may include Pin or Wavy fins or a diecast construction with different cooling structures (Pins, Wavy Pins, Fins, etc.) The material of the heatsink 202 (including copper plate 746) may be selected based on the thermal performance required to draw heat away from power module 208. For example, the heatsink 202 may include an aluminum alloy or copper. The heatsink 202 may be in contact with the power modules 208 by using a hard or a soft TIM 760 (as shown in FIG. 7A). The second surface 254 may be a heatsink cover built as a sheet metal component.

One or more embodiments of the system described herein may provide thermal management of the power module with multiple cooling elements, thermal management of the power module(s), and thermal management of the inner temperature of the inverter. One or more embodiments may the decrease the complexity and cost of assembling inverter housing components (e.g., an inverter cover) and the scrap rate of the components within the inverter system.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system for an electric vehicle, the system comprising:
   an inverter housing including an inner wall, a first channel, and an exterior surface;
   a heatsink coupled to the exterior surface of the inverter housing, the heatsink including a second channel;
   an inverter housing cover; and
   a printed circuit board on an opposite side of the heatsink from the inverter housing cover;

wherein the first channel is defined by the inner wall of the inverter housing and the inverter housing cover, wherein the first channel in the inverter housing and the second channel in the heatsink define a cooling circuit, and wherein the first channel is fluidly connected to the second channel to pass a coolant through the cooling circuit.

2. The system of claim 1, wherein the cooling circuit further includes two connection channels connecting the first channel and the second channel.

3. The system of claim 2, wherein the two connection channels are in the heatsink.

4. The system of claim 1, wherein the heatsink is coupled to the inverter housing by a stir weld.

5. The system of claim 1, further comprising:
a gasket to fluidly seal the heatsink to the inverter housing.

6. The system of claim 1, wherein the heatsink further includes fins in the second channel.

7. The system of claim 1, wherein the inverter housing further includes fins in the first channel.

8. An inverter comprising the system of claim 1, wherein the inverter includes:
the inverter housing,
the heatsink, and
a power module coupled to the inverter housing, the power module configured to switch direct current electricity into alternating current,
wherein the heatsink is configured to cool the power module.

9. A vehicle comprising the inverter of claim 8.

10. An inverter comprising:
a housing including a first cooling channel and an inner wall;
a heatsink including a second cooling channel, wherein the heatsink is coupled to the housing,
an inverter housing cover; and
a printed circuit board on an opposite side of the heatsink from the inverter housing cover;
wherein the first cooling channel is defined by the inner wall of the housing and the inverter housing cover,
wherein the first cooling channel and the second cooling channel provide a cooling circuit for the inverter.

11. The inverter of claim 10, wherein the first cooling channel includes fins.

12. The inverter of claim 10, wherein the second cooling channel includes fins.

13. The inverter of claim 10, wherein the heatsink is coupled to the housing by a weld.

14. The inverter of claim 10, wherein the cooling circuit further includes two connection channels connecting the first cooling channel and the second cooling channel.

15. A system comprising:
an inverter configured to convert DC power from a battery to AC power to drive a motor, wherein the inverter includes:
a power module;
an inverter housing coupled to the power module, the inverter housing including a first channel and an inner wall;
an inverter housing cover to cover the first channel; and
a heatsink coupled to the inverter housing, the heatsink including a second channel and two connection channels, and
a printed circuit board on an opposite side of the heatsink from the inverter housing cover;
wherein the first channel is defined by the inner wall of the inverter housing and the inverter housing cover,
wherein the first channel is fluidly connected to the second channel by the two connection channels to pass a coolant through the inverter to cool the power module.

16. The system of claim 15, wherein the first channel includes fins.

17. The system of claim 15, wherein the second channel includes fins.

18. The system of claim 15, wherein the heatsink is coupled to the inverter housing by a weld.

* * * * *